United States Patent
Pu et al.

(10) Patent No.: US 7,489,044 B2
(45) Date of Patent: Feb. 10, 2009

(54) SEMICONDUCTOR PACKAGE AND FABRICATION METHOD THEREOF

(75) Inventors: Han-Ping Pu, Taipei Hsien (TW); Cheng-Hsu Hsiao, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 121 days.

(21) Appl. No.: 11/592,046

(22) Filed: Nov. 1, 2006

(65) Prior Publication Data
US 2008/0012111 A1    Jan. 17, 2008

(30) Foreign Application Priority Data
Jul. 11, 2006    (TW) .............................. 95125203 A

(51) Int. Cl.
H01L 23/48    (2006.01)
H01L 23/52    (2006.01)

(52) U.S. Cl. ................. 257/787; 257/784; 257/E23.061

(58) Field of Classification Search ................. 257/787, 257/784, E23.061
See application file for complete search history.

(56) References Cited

U.S. PATENT DOCUMENTS

| | | | | |
|---|---|---|---|---|
| 6,043,109 A * | 3/2000 | Yang et al. | ................. | 438/113 |
| 6,483,184 B2 * | 11/2002 | Murata | ........................ | 257/698 |
| 6,552,426 B2 * | 4/2003 | Ishio et al. | .................. | 257/692 |
| 6,723,585 B1 * | 4/2004 | Tu et al. | ...................... | 438/123 |
| 6,815,254 B2 * | 11/2004 | Mistry et al. | ................. | 438/108 |
| 7,227,243 B2 * | 6/2007 | Shizuno | ...................... | 257/619 |
| 7,315,077 B2 * | 1/2008 | Choi et al. | ................... | 257/666 |

* cited by examiner

Primary Examiner—Nitin Parekh
(74) Attorney, Agent, or Firm—Peter F. Corless; Steven M. Jensen; Edwards Angell Palmer & Dodge LLP

(57) ABSTRACT

The present invention provides a semiconductor package and a fabrication method thereof. The method includes the steps of: providing a chip carrier module having a plurality of chip carriers, disposing a plurality of electrical connecting points on the chip carriers, performing chip mounting and molding on the chip carrier module to form an encapsulant encapsulating the semiconductor chip, exposing the electrical connecting points from the encapsulant; forming a patterned circuit layer on the encapsulant, electrically connecting the patterned circuit layer to the electrical connecting points, cutting and separating the chip carriers to form a plurality of semiconductor packages each having a circuit layer formed on the encapsulant such that the circuit layer provides extra electrical connecting points and thereby enhances electrical performance of electrical products. During a package stacking process, no package is limited by the design of another package below.

11 Claims, 12 Drawing Sheets

US 7,489,044 B2

SEMICONDUCTOR PACKAGE AND FABRICATION METHOD THEREOF

BACKGROUND OF THE INVENTION

1. Field of the Invention

The present invention relates to a semiconductor package and a fabrication method thereof, and more particularly to semiconductor packages each with an extra plurality of electrical connecting points and a fabrication method thereof.

2. Description of the Prior Art

Owing to the trend toward multi-function, high-performance, and high-speed electronic products, semiconductor manufacturers nowadays are devoted to research and development of semiconductor devices integrated with multiple chips or packages with a view to meeting the requirement for today's electronic products.

Referring to FIG. 1, U.S. Pat. No. 5,222,014 discloses a stack structure of a semiconductor package, and a method for fabricating the stack structure of a semiconductor package involves providing a first ball grid array (BGA) substrate 11 having bonding pads 110 disposed thereon, mounting a semiconductor chip 10 on the first BGA substrate 11, forming an encapsulant 13 on the first BGA substrate 11 such that the encapsulant 13 encapsulates the semiconductor chip 10, mounting and electrically connecting a second BGA substrate 12 (which has been packaged like the first BGA substrate 11) to the bonding pads 110 via solder balls 14.

However, in the stack structure of the semiconductor package described above, the number of the bonding pads 110 electrically connecting the second BGA substrate 12 with the first BGA substrate 11 is restricted by the size of the encapsulant 13, thus limiting the type of semiconductor packages to be stacked and the number of I/O connections that can be formed, such that the type of semiconductor packages to be stacked and I/O connection layout on the second BGA substrate 12 would be restricted by the bonding pad 110 arrangement on the first BGA substrate 11. Moreover, due to the height limitation of the solder balls 14, the height of the encapsulant 13 disposed on the first BGA substrate 11 must be minimized (typically below 0.3 mm), which increases the difficulty of fabrication. Other stack structures of semiconductor packages such as that disclosed in U.S. Pat. Nos. 6,025,648 and 6,828,665 also experienced the same problem.

Besides, in accordance with the foregoing known stack structures of semiconductor packages, electrical connecting points for forming electrical connections with external devices rely totally on the circuits on the substrate surface, while the encapsulant which occupies the majority of space in a package, however, is incapable of providing extra electrical connecting points, such that not only the overall electrical performance of the semiconductor product cannot be improved, the usage of the package would also be limited.

Thus, there is an urgent need to develop a semiconductor package and a method for fabricating the same, for providing an extra plurality of electrical connecting points, thereby solving the problem of package usage limitation, improving the electrical performance of electronic products and overcoming the stacking limitation in terms of size and type of semiconductor packages and the number of I/O connections.

SUMMARY OF THE INVENTION

In light of the foregoing drawbacks of the prior art, a primary objective of the present invention is to provide semiconductor packages and a fabrication method thereof for additionally providing a plurality of electrical connecting points, so as to enhance the electrical performance of an electronic product.

Another objective of the present invention is to provide semiconductor packages and a fabrication method thereof such that electrical connecting points can be formed on the surface of an encapsulant of the semiconductor packages.

Yet another objective of the present invention is to provide semiconductor packages and a fabrication method thereof, allowing direct electrical stacking of semiconductor packages.

Further another objective of the present invention is to provide semiconductor packages and a fabrication method thereof, such that during a package stacking process no package is limited by the design of another package below.

In order to achieve the foregoing and other objectives, the present invention discloses semiconductor packages and a fabrication method thereof. The fabrication method involves: preparing a chip carrier module having a plurality of chip carriers with each of the chip carriers having a plurality of electrical connecting points disposed thereon; mounting and electrically connecting a semiconductor chip to each of the chip carriers; forming on the chip carrier module an encapsulant for encapsulating the semiconductor chip; forming in the encapsulant openings corresponding in position to the electrical connecting points, or forming in the encapsulant grooves corresponding in position to a path linking up the electrical connecting points, with a view to exposing the electrical connecting points from the encapsulant; forming on the encapsulant a circuit layer coupling electrically to the electrical connecting points exposed from the encapsulant; and performing a cutting process along edges of the chip carriers, to form a plurality of semiconductor packages.

With the aforesaid fabrication method, the present invention also discloses a semiconductor package. The semiconductor package comprises: a chip carrier having a plurality of electrical connecting points; a semiconductor chip mounted and electrically connected to the chip carrier; an encapsulant formed on the chip carrier and configured to encapsulate the semiconductor chip, allowing the electrical connecting points of the chip carrier to be exposed from the encapsulant; and a circuit layer formed on the encapsulant and electrically coupled to the electrical connecting points exposed from the encapsulant.

The electrical connecting points on the chip carrier can be formed along a junction of every two adjacent ones of the chip carriers, so that when a cutting process is performed along the cutting path, which passes through the electrical connecting points to separate the chip carriers, each package can keep a portion of the electrical connecting points on the edge, which is electrically coupled to the circuit layer on the encapsulant to serve as additional electrical connecting points for establishing electrical connections with external devices. In addition, the electrical connecting points can be formed on the edge inside the chip carrier, such that the semiconductor package is capable of utilizing both the electrical connecting points on the chip carrier and the circuit layer on the encapsulant to establish electrical connections with external devices.

The chip carrier can be a substrate or leadframe. The electrical connecting points can be pads or leads. The semiconductor chip can be electrically connected to the chip carrier by a flip-chip method or a wire bonding method.

Accordingly, in summary, semiconductor packages and a fabrication method thereof provided by the present invention, involves providing a chip carrier module having a plurality of chip carriers, performing chip mounting and molding to form an encapsulant for encapsulating the semiconductor chip, forming a plurality of openings for exposing the electrical connecting points and a patterned circuit layer on the encapsulant, connecting electrically the circuit layer to the electrical connecting points, and performing a cutting process to separate the chip carriers from each other so as to form a plurality of semiconductor packages. A circuit layer is formed on the encapsulant of each semiconductor package, to provide additional electrical connecting points, such that the semiconductor packages can be vertically stacked or horizontally coupled with another semiconductor package, so as to enhance the electrical performance of electronic products. Moreover, during a package stacking process, no package is limited by the design of another package below.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

First Preferred Embodiment

Referring to FIGS. 2A to 2G, which are schematic views of the semiconductor packages and the fabrication method thereof in accordance with the first preferred embodiment of the present invention.

Figure 1:
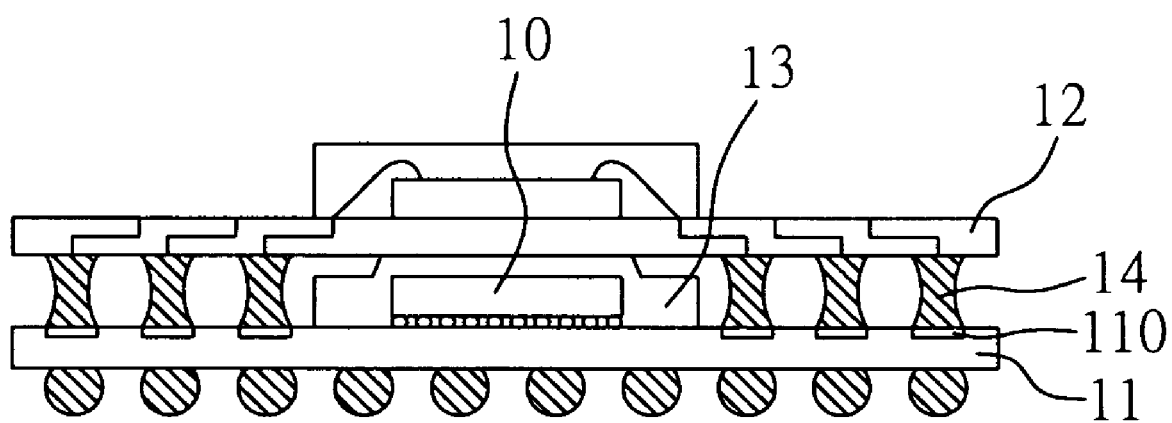
FIG. 1 is a schematic view showing a stack structure of semiconductor packages disclosed in U.S. Pat. No. 5,222,014.
Figure 2A:
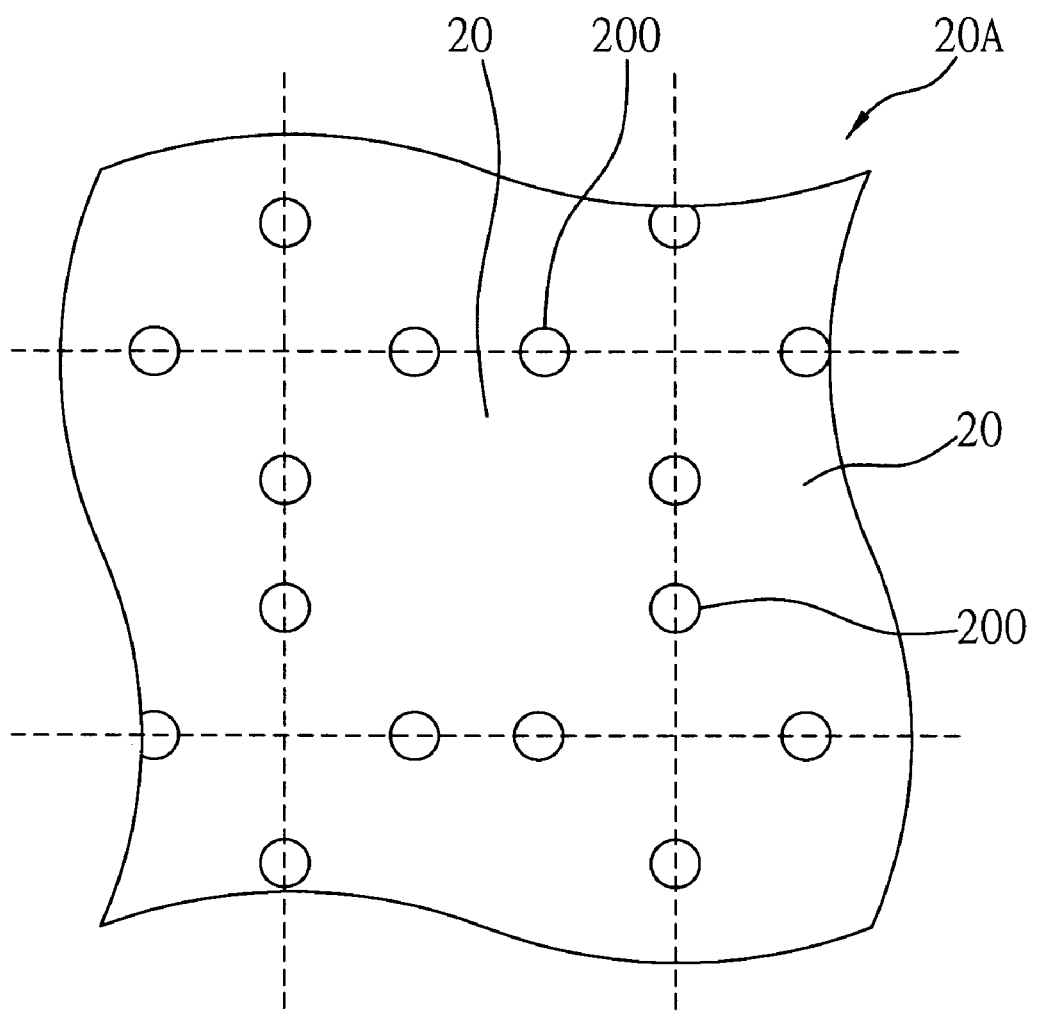
FIGS. 2A to 2G are schematic views showing semiconductor packages and a fabrication method thereof in accordance with the first preferred embodiment of the present invention.
Figure 2B:
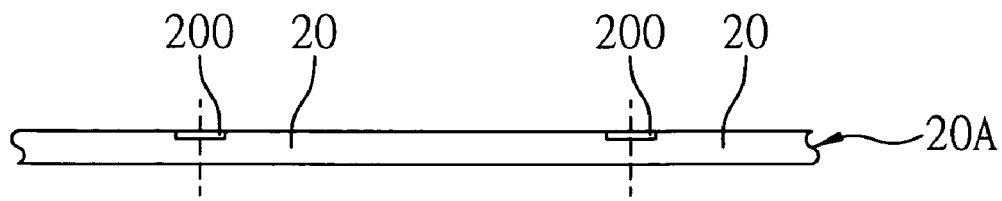

As shown in FIGS. 2A and 2B, FIG. 2B is a cross-sectional view of FIG. 2A. First, a chip carrier module with a plurality of chip carriers is provided, and each of the chip carriers is formed with a plurality of electrical connecting points. In the present embodiment, the chip carrier module is a substrate module 20A, and the chip carriers are Ball Grid Array (BGA) or Land Grid Array (LGA) substrates 20. The substrates 20 are defined by a plurality of transverse and longitudinal cutting lines (as indicated by dashed lines). A plurality of electrical connecting points, such as connecting pads 200, are formed along a junction of every two adjacent ones of the substrates 20.

Figure 2C:
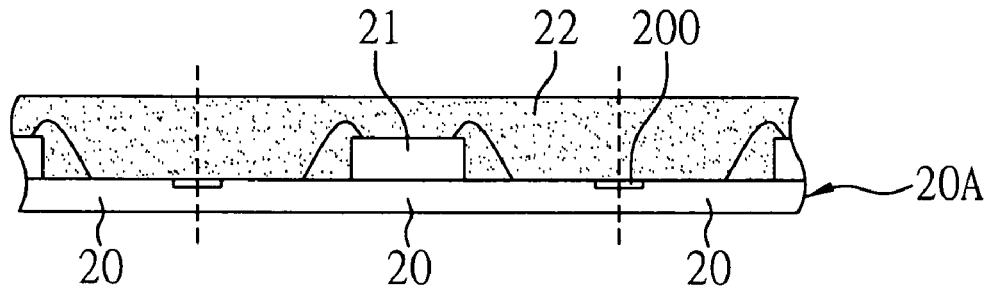

As shown in FIG. 2C, a semiconductor chip 21 is mounted and electrically connected to each of the substrates 20 of the substrate module 20A, and an encapsulant 22 is formed on the substrate module 20A so as to encapsulate the semiconductor chip 21 and the connecting pads 200. The semiconductor chip 21 is electrically connected to each of the substrates 20 by a wire bonding method or a flip-chip method.

Figure 2D:
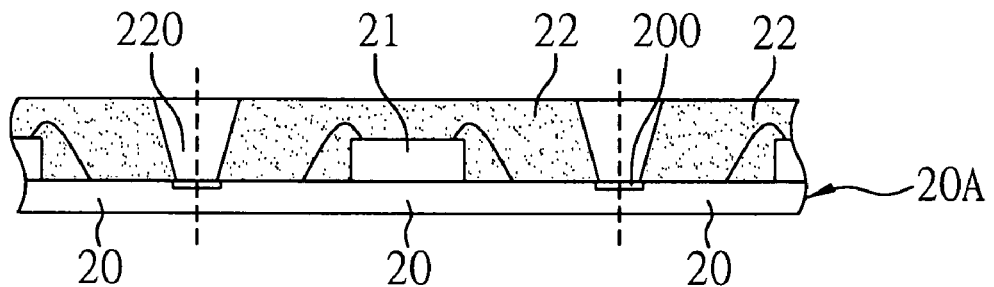

As shown in FIG. 2D, with, for example, a laser drilling method, a plurality of openings 220 corresponding in position to the connecting pads 200 are formed in the encapsulant 22, allowing the connecting pads 200 to be exposed from the encapsulant 22.

Figure 2E:
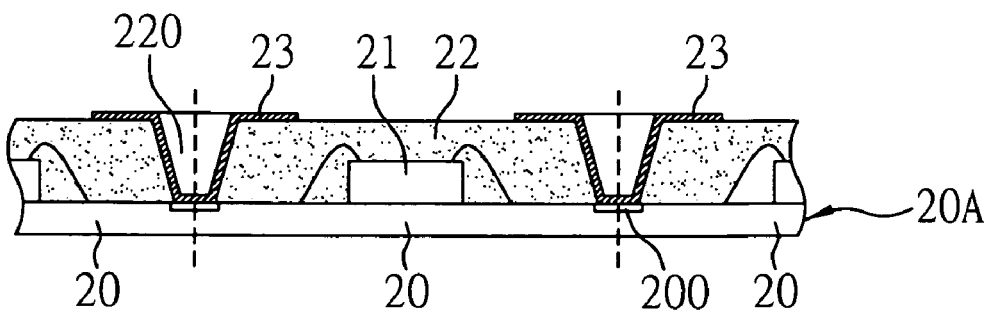

As shown in FIG. 2E, with a patterning process, a circuit layer 23 is formed on the encapsulant 22, allowing the circuit layer 23 to be electrically coupled to the connecting pads 200 exposed from the encapsulant 22, through the openings 220 formed in the encapsulant 22.

Figure 2F:
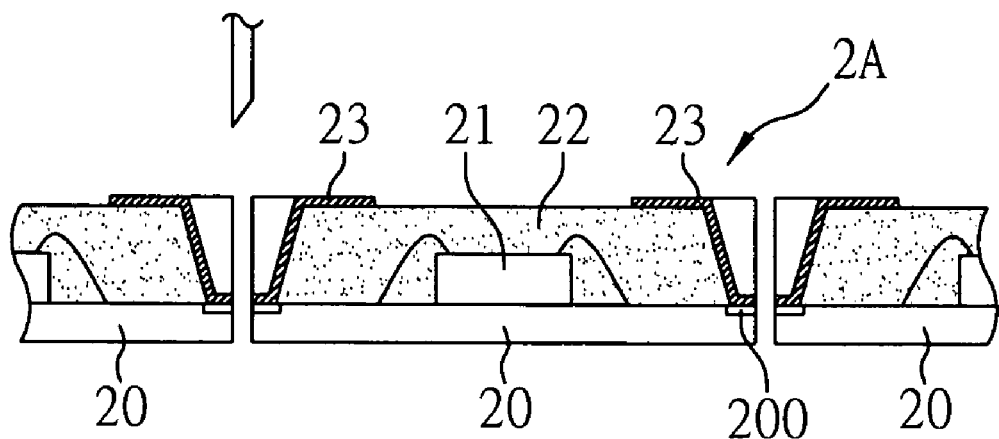
Figure 2G:
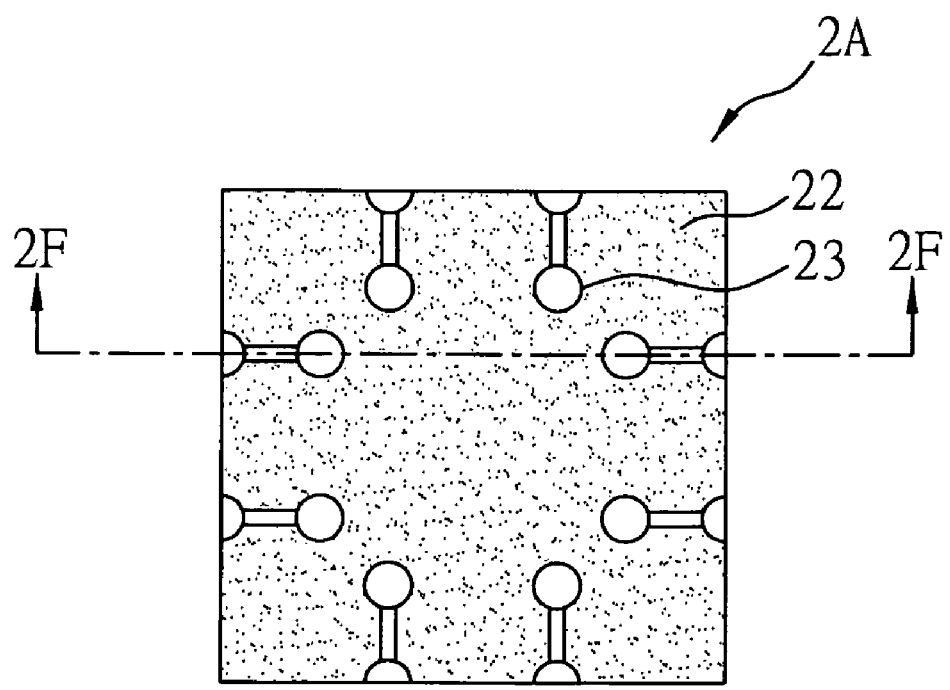

As shown in FIGS. 2F and 2G, a cutting process is performed along edges of the substrates 20 (as indicated by dashed lines), to form a plurality of semiconductor packages 2A. FIG. 2G is a top view of the semiconductor packages 2A. FIG. 2F is a cross-sectional view of FIG. 2G. Since the connecting pads 200 of the substrates 20 are formed along a junction of every two adjacent ones of the substrates 20, during the cutting process performed along the junction of every two adjacent ones of the substrates 20, the cutting path passes through the connecting pads 200 such that, after separating the substrates 20 from each other and forming the semiconductor packages 2A, the outermost edge of each of the substrates 20 still keeps a portion of the connecting pads 200, allowing the semiconductor packages 2A to be electrically coupled to the circuit layer 23 on the encapsulant 22 via the remaining portion of the connecting pads 200. As a result, the circuit layer 23 functions as additional electrical connecting points for the semiconductor packages 2A.

With the foregoing fabrication method, the present invention also discloses a semiconductor package. The semiconductor package comprises: a chip carrier such as a substrate 20, at least one semiconductor chip 21, an encapsulant 22, and a circuit layer 23. The substrate 20 comprises a plurality of electrical connecting points such as connecting pads 200. The semiconductor chip 21 is electrically connected to the substrate 20 by a wire bonding method or a flip-chip method. The encapsulant 22 is formed on the substrate 20 so as to encapsulate the semiconductor chip 21, allowing the connecting pads 200 of the substrate 20 to be exposed from the encapsulant 22. The circuit layer 23 is formed on the encapsulant 22 and electrically coupled to the connecting pads 200 exposed from the encapsulant 22. The circuit layer 23 can be disposed on both the top surface and the lateral surface of the encapsulant 22, allowing the semiconductor package to establish electrical connections with external devices via the circuit layer 23 exposed from the encapsulant 22.

Second Preferred Embodiment

Referring to FIGS. 3A to 3F, which are schematic views of the semiconductor packages and the fabrication method thereof in accordance with the second preferred embodiment. The present embodiment is substantially the same as the foregoing embodiment. Therefore the corresponding same elements will not be described in detail, but with only the differences being emphasized.

Figure 3A:
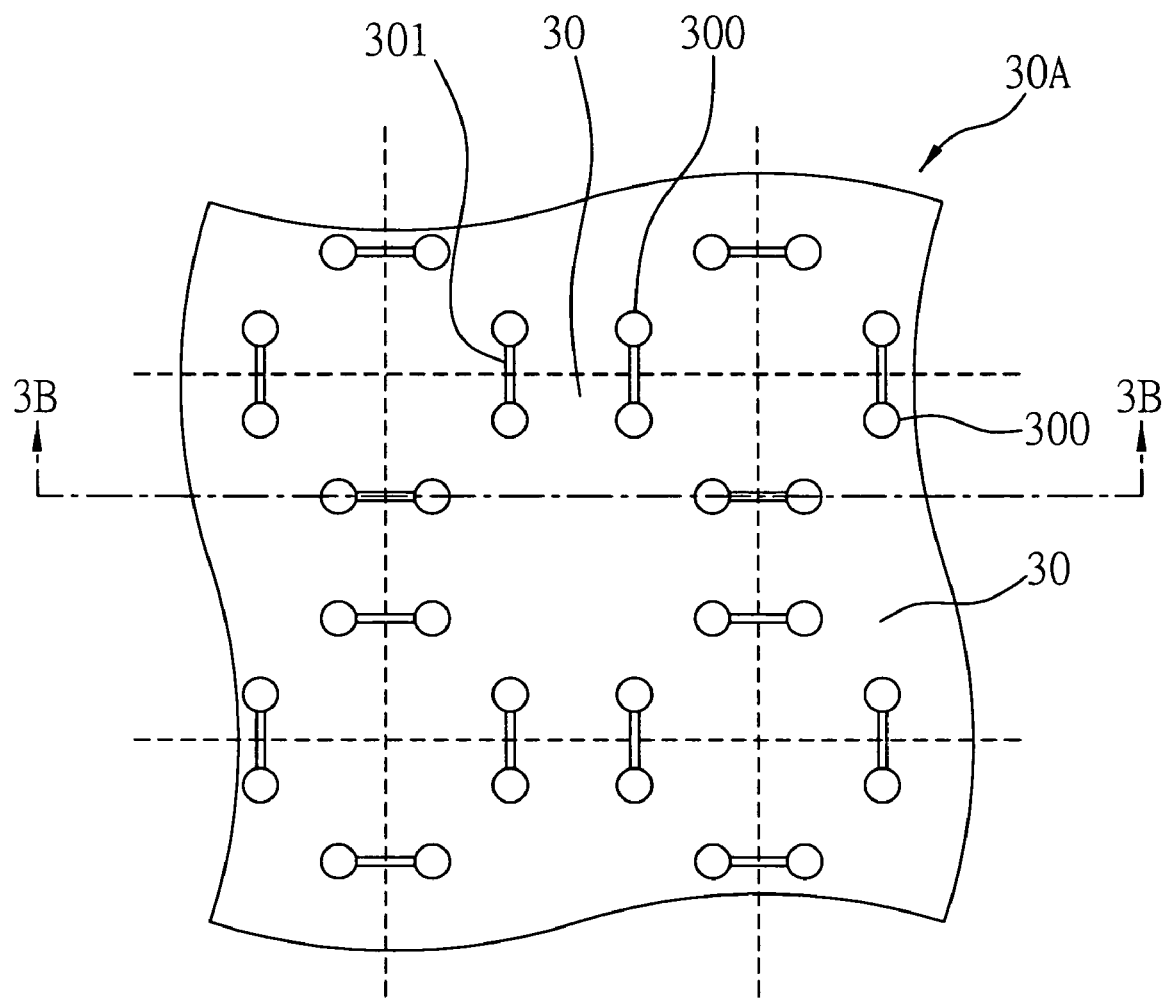
FIGS. 3A to 3F are schematic views showing a substrate module used in the second embodiment of semiconductor packages and a fabrication method thereof in accordance with the present invention.
Figure 3B:
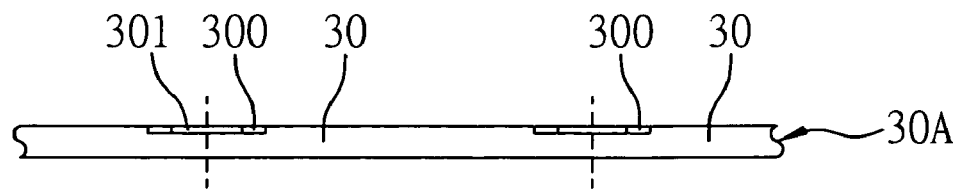

As shown in FIGS. 3A and 3B, a substrate module 30A with a plurality of substrates 30 is provided, and a plurality of electrical connecting points, such as connecting pads 300, are disposed on internal surfaces and peripheries of each of the substrates 30. Adjacent ones of the connecting pads 300 are electrically connected to each other by connecting wires 301.

Figure 3C:
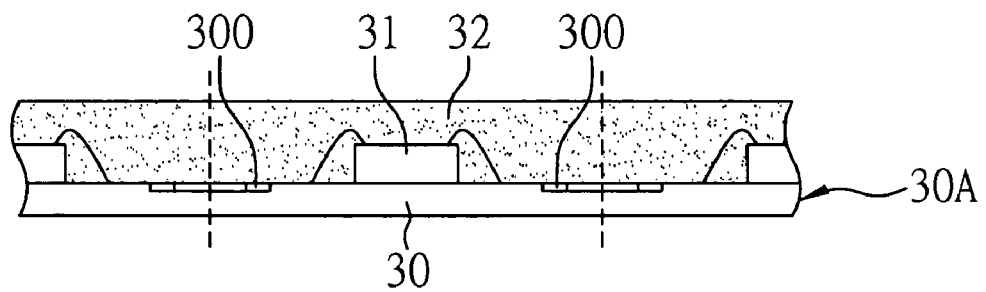

As shown in FIG. 3C, chip mounting and molding processes are performed to mount semiconductor chips 31 on the substrates 30 of the substrate module 30A, and form an encapsulant 32 for encapsulating the semiconductor chips 31.

Figure 3D:
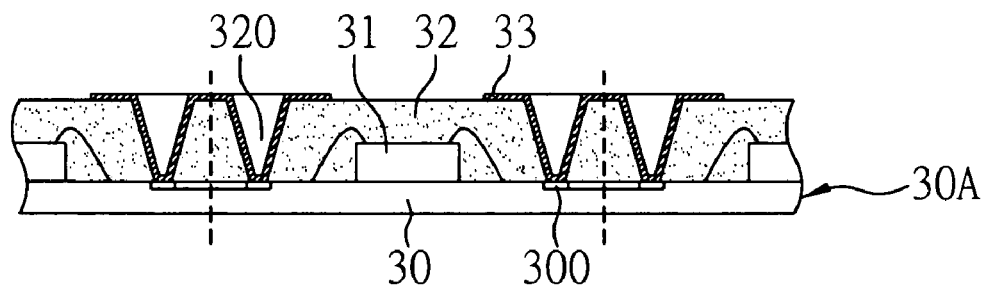

As shown in FIG. 3D, a plurality of openings 320 are formed in the encapsulant 32, allowing the connecting pads 300 of each of the substrates 30 to be exposed from the encapsulant 32. A circuit layer 33 is formed on the encapsulant 32 and is electrically coupled to the connecting pads 300 exposed from the encapsulant 32.

Figure 3E:
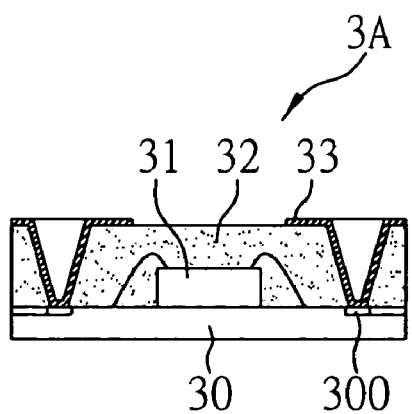
Figure 3F:
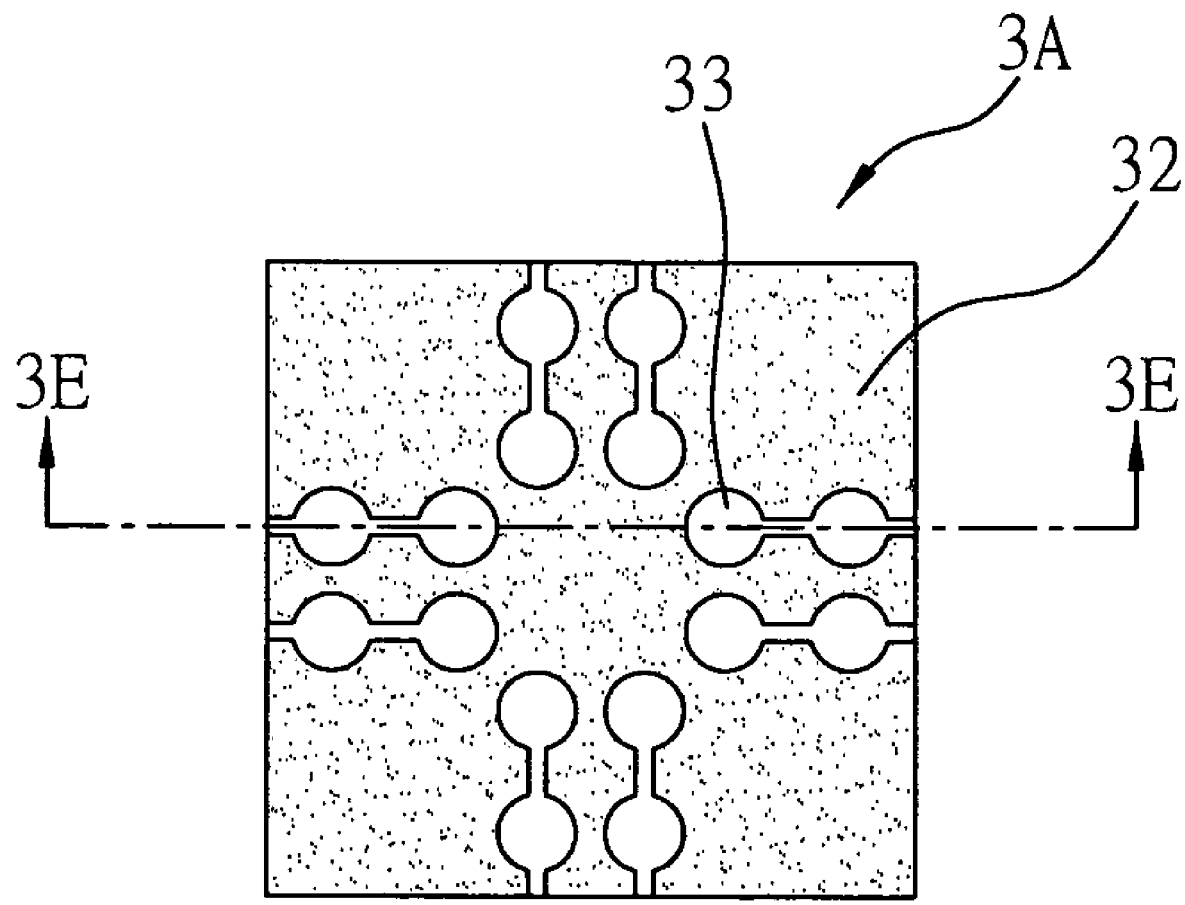

As shown in FIGS. 3E and 3F, in which FIG. 3F is a top view of FIG. 3E, a cutting process is performed, and the cutting path passes through the connecting wires 301 of the substrates 30, to separate the substrates 30 from each other, so as to complete the formation of semiconductor packages 3A with a circuit layer 33 on the outer surface of the encapsulant 32 for providing additional electrical connecting points.

Third Preferred Embodiment

FIGS. 4A to 4F show the fabrication method of the semiconductor packages of the third embodiment of the present invention. The present embodiment is substantially the same as the foregoing embodiment, therefore the corresponding elements are not described in detail, though differences are emphasized.

Figure 4A:
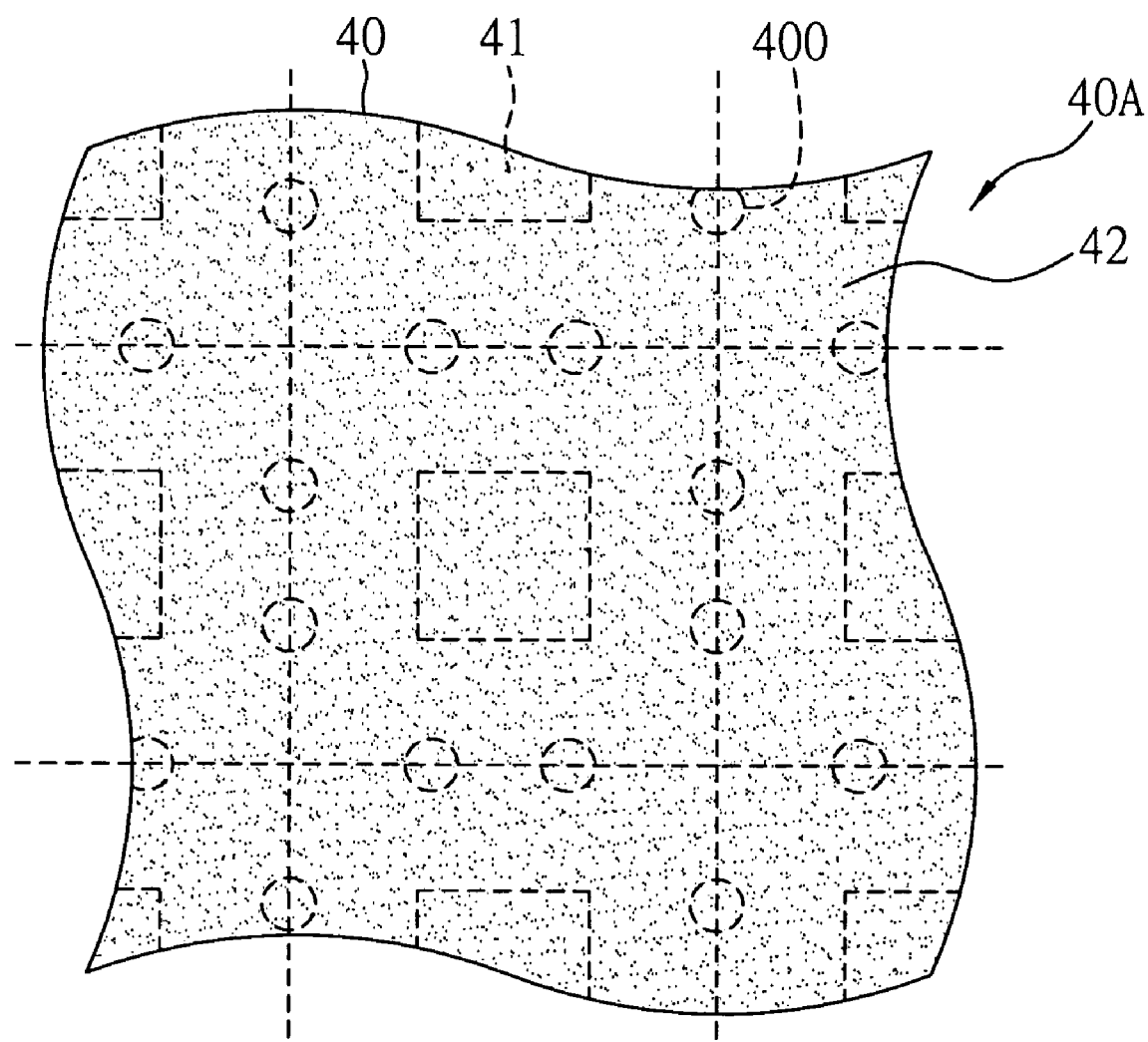
FIGS. 4A to 4F are schematic views showing a substrate module used in the third embodiment of semiconductor packages and a fabrication method thereof in accordance with the present invention.

As shown in FIG. 4A, first, a chip carrier module with a plurality of chip carriers is provided, and each of the chip carriers is disposed with a plurality of electrical connecting points. In this embodiment, the chip carrier module is a substrate module 40A, and the chip carriers are Ball Grid Array (BGA) or Land Grid Array (LGA) substrates 40. The substrates 40 are defined by a plurality of transverse and longitudinal cutting lines (shown as dashed lines). Subsequently, a plurality of electrical connecting points, such as connecting pads 400, are formed along a junction of every two adjacent ones of the substrates 40. Semiconductor chips 41 are mounted and electrically connected to the substrates 40. An encapsulant 42 for encapsulating the semiconductor chips 41 and the connecting pads 400 is then formed on the substrate module 40A.

Figure 4B:
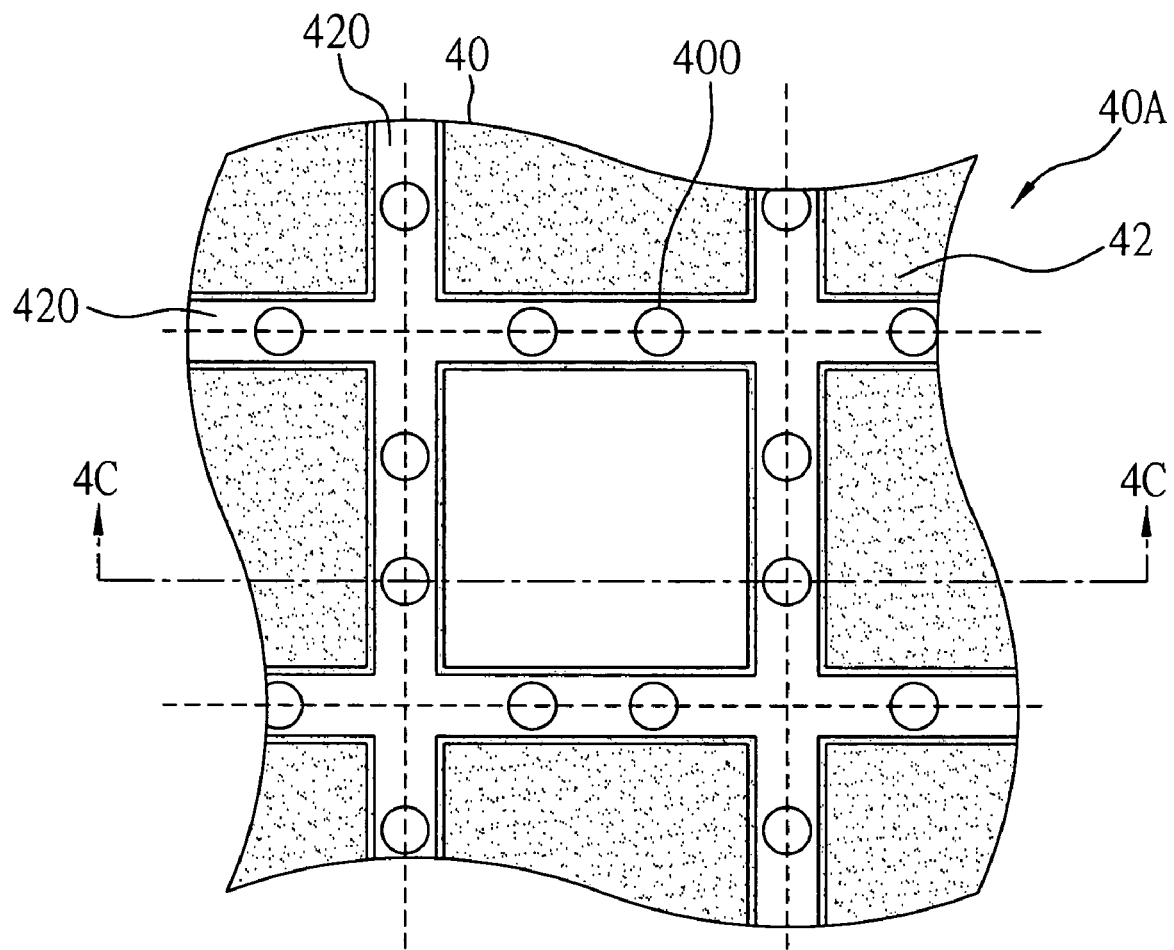
Figure 4C:
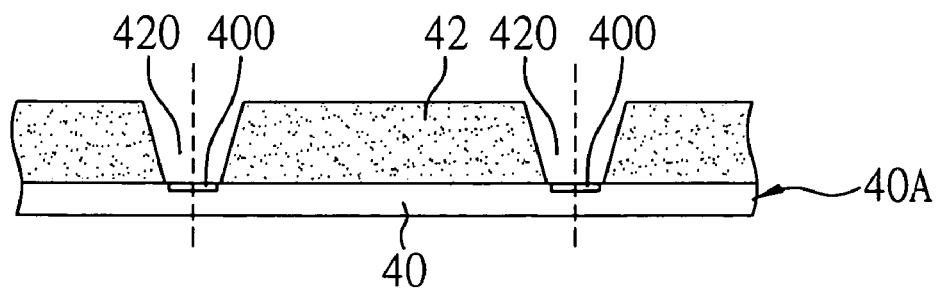

As shown in FIGS. 4B and 4C, in which FIG. 4C is a cross-sectional view of FIG. 4B, a removing process is performed, by following a predetermined cutting path, that is, a path passing through the connecting pads 400, to remove a portion of the encapsulant 42 corresponding in position to the cutting lines (where the connecting pads 400 are positioned), so as to form in the substrate module 40A a plurality of grid-like grooves 420 for exposing the connecting pads 400.

Figure 4D:
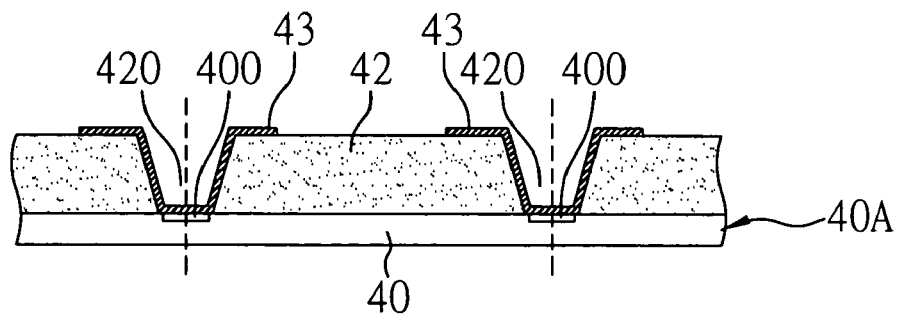

As shown in FIG. 4D, through a patterning process, a circuit layer 43 is formed on the encapsulant 42, and the circuit layer 43 is electrically coupled to the connecting pads 400.

Figure 4E:
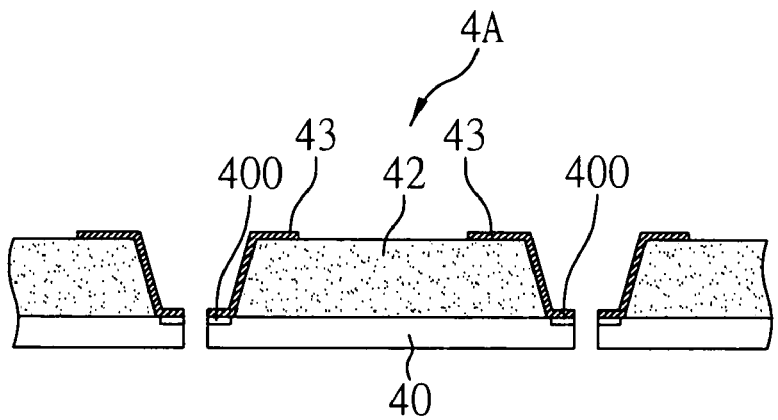
Figure 4F:
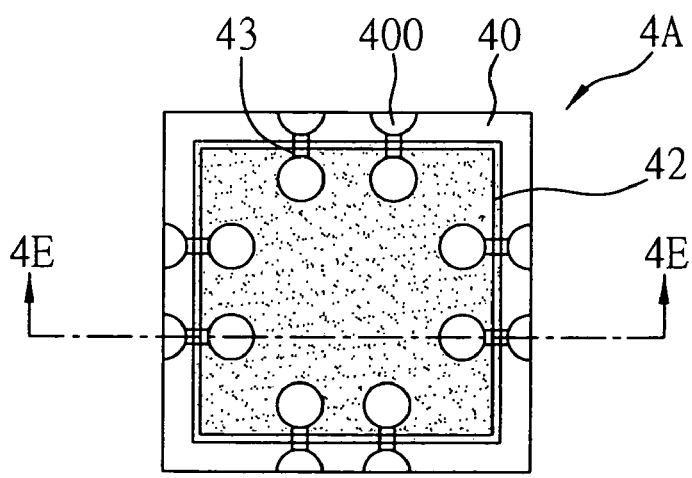

As shown in FIGS. 4E and 4F, in which FIG. 4F is a top view of FIG. 4E, a cutting process is performed by following a cutting line (indicated by dashed lines) around the edges of the substrates 40, to form a plurality of semiconductor packages 4A. Since the connecting pads 400 of the substrates 40 are formed along a junction of every two adjacent ones of the substrates 40, the cutting path passes through the connecting pads 400, and thus the substrates 40 are separated from each other so as to form a plurality of semiconductor packages 4A, such that the outermost edge of each of the substrates 40 of any two adjacent ones of the semiconductor packages 4A keeps a portion of the connecting pads 400, allowing the semiconductor packages 4A to be electrically coupled to the circuit layer 43 on the encapsulant 42 via the connecting pads 400, and thus the circuit layer 43 functions as additional electrical connecting points for the semiconductor packages 4A.

The most important distinguishing feature of the semiconductor packages 4A in this embodiment compared to that of the foregoing embodiment is that in this embodiment a portion of the encapsulant 42 corresponding in position to a periphery of the substrates 40 is formed with circular notches and thereby does not completely cover the surfaces of the substrates 40, allowing the connecting pads 400 disposed on the periphery of the substrates 40 to be exposed from the encapsulant 42, so as to establish electrical connections with the circuit layer 43.

Fourth Preferred Embodiment

Figure 5:
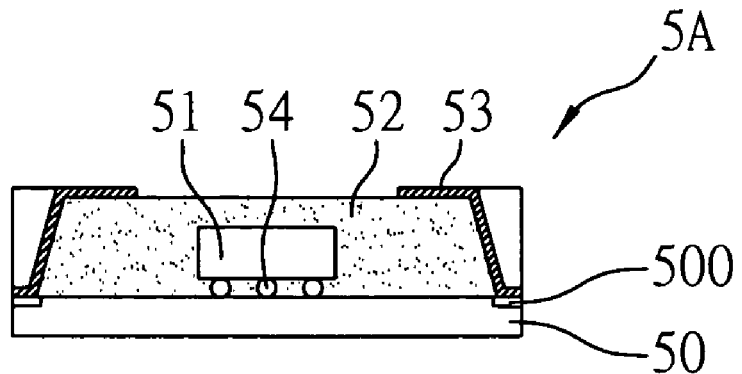
FIG. 5 is a schematic view showing a semiconductor package of the fourth preferred embodiment of the present invention.

Referring to FIG. 5, a schematic view of the semiconductor package of the fourth embodiment of the present invention is shown. As shown in the drawing, the present embodiment is substantially the same as the foregoing embodiment, with the major difference being that in the semiconductor package 5A of the present embodiment, the semiconductor chip 51 is electrically connected to the chip carrier 50 by a flip-chip method, using a plurality of conductive bumps 54. Following that, an encapsulant 52 is formed to encapsulate the semiconductor chip 51, and then a circuit layer 53 electrically connected to the electrical connecting points 500 is formed on the encapsulant 52, such that the circuit layer 53 functions as additional electrical connecting points.

Fifth Preferred Embodiment

Figure 6:
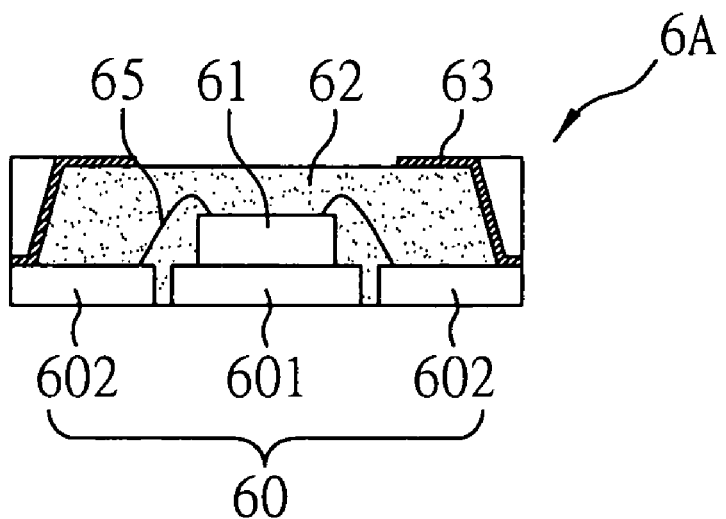
FIG. 6 is a schematic view showing a semiconductor package of the fifth preferred embodiment of the present invention.

Refereeing to FIG. 6, a schematic cross-sectional view of the semiconductor package of the fifth preferred embodiment of the present invention is shown. As shown in the drawing, the present embodiment is substantially the same as the foregoing embodiment, with the major difference being that in the semiconductor package 6A of the present embodiment, a leadframe is used as a chip carrier. The leadframe 60 has a die pad 601 and a plurality of electrical connecting points such as leads 602, allowing a semiconductor chip 61 to be mounted on the die pad 601 and electrically connected to the leads 602 by means of bonding wires 65. Following that, an encapsulant 62 is formed to encapsulate the semiconductor chip 61 and the bonding wires 65, allowing a portion of the leads 602 to be exposed from the encapsulant 62. A patterning process is performed to form a circuit layer 63 on the encapsulant 62, allowing the circuit layer 63 to be electrically coupled to the leads 602 exposed from the encapsulant 62, such that the circuit layer 63 functions as additional electrical connecting points.

Figure 7A:
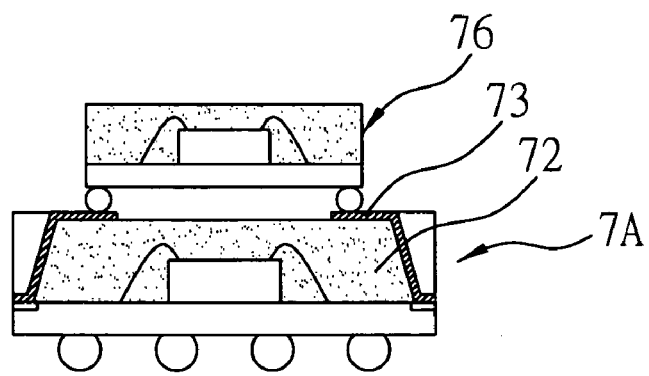
FIGS. 7A and 7B are schematic views showing the application of semiconductor packages of the present invention.
Figure 7B:
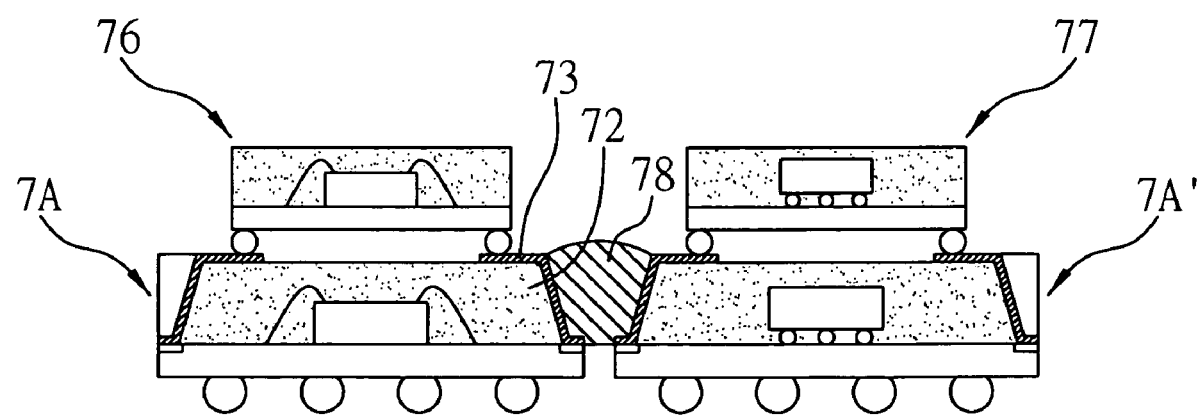

Referring to FIGS. 7A and 7B, the application of the semiconductor packages of the present invention is demonstrated. As shown in FIG. 7A, as regards a semiconductor package 7A, a circuit layer 73 exposed from an encapsulant 72 functions as electrical connecting points, and another semiconductor package 76 is stacked on and electrically connected to the semiconductor package 7A.

In addition, as shown in FIG. 7B, apart from stacking the semiconductor package 76 on the semiconductor package 7A, another semiconductor package 7A' can be electrically connected, in a horizontal direction, to the semiconductor package 7A by a conductive adhesive 78 disposed on the circuit layer 73 on the lateral side of the encapsulant 72. Moreover, another semiconductor package 77 can be stacked on top of and electrically connected to the semiconductor package 7A'.

Accordingly, in summary, the present invention discloses semiconductor packages and a fabrication method thereof, and the fabrication method involves providing a chip carrier module having a plurality of chip carriers each disposed with a plurality of electrical connecting points, performing chip mounting and molding on the chip carrier module so as to form an encapsulant for encapsulating a semiconductor chip, forming in the encapsulant a plurality of openings for exposing the electrical connecting points, forming a patterned circuit layer on the encapsulant, coupling electrically the circuit layer to the electrical connecting points, and performing a cutting process to separate the chip carriers to form a plurality of semiconductor packages. A circuit layer is formed on the encapsulant of each of the semiconductor packages, to provide additional electrical connecting points and thereby enable vertical stacking or horizontal coupling of semiconductor packages. With the present invention, electrical performance of electronic products is enhanced, and, during a package stacking process, no package is limited by the design of another package below.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
   a chip carrier disposed with a plurality of electrical connecting points;
   a semiconductor chip mounted and electrically connected to the chip carrier;
   an encapsulant formed on the chip carrier and configured to encapsulate the semiconductor chip such that the electrical connecting points of the chip carrier are exposed from the encapsulant; and
   a circuit layer formed on the encapsulant and connected electrically to the electrical connecting points exposed from the encapsulant,
   wherein openings are formed in the encapsulant at positions corresponding to the electrical connecting points, allowing the electrical connecting points to be exposed from the encapsulant.

2. The semiconductor package of claim 1, wherein the electrical connecting points are disposed on an outermost edge of the chip carrier.

3. The semiconductor package of claim 1, wherein the electrical connecting points are disposed inside the chip carrier.

4. The semiconductor package of claim 1, wherein the electrical connecting points are connecting pads.

5. The semiconductor package of claim 1, wherein the chip carrier is one of a Thin Fine-Pitch Ball Grid Array (TFBGA) substrate and a Land Grid Array (LGA) substrate.

6. The semiconductor package of claim 1, wherein the semiconductor chip is electrically connected to the chip carrier by one of a flip-chip method and a wire bonding method.

7. The semiconductor package of claim 1, wherein the chip carrier is a lead frame having a die pad and a plurality of leads acting as the electrical connecting points.

8. The semiconductor package of claim 7, wherein the lead is partially exposed from the encapsulant, allowing the circuit layer to be electrically connected to the lead.

9. The semiconductor package of claim 1, wherein the semiconductor package is electrically stacked thereon with another semiconductor package, using a portion of the circuit layer exposed from a top surface of the encapsulant as one of the electrical connecting points.

10. The semiconductor package of claim 1, further connecting electrically to another semiconductor package horizontally by a conductive adhesive on the circuit layer exposed from a lateral side of the encapsulant.

11. The semiconductor package of claim 1, wherein the encapsulant is formed with circular notches corresponding in position to an outer edge of the chip carrier such that the electrical connecting points are exposed through the circular notches.

* * * * *